United States Patent
Cho et al.

(10) Patent No.: US 9,520,459 B2
(45) Date of Patent: Dec. 13, 2016

(54) SURFACE TREATMENT METHOD FOR SEMICONDUCTOR DEVICE

(71) Applicant: SK hynix Inc., Gyeonggi-do (KR)

(72) Inventors: Sung-Hyuk Cho, Gyeonggi-do (KR);
Hyo-Sang Kang, Gyeonggi-do (KR);
Sung-Ki Park, Gyeonggi-do (KR);
Kwon Hong, Gyeonggi-do (KR);
Hyung-Soon Park, Gyeonggi-do (KR);
Hyung-Hwan Kim, Gyeonggi-do (KR);
Young-Bang Lee, Gyeonggi-do (KR);
Ji-Hye Han, Gyeonggi-do (KR);
Tae-Yeon Jung, Gyeonggi-do (KR);
Hyeong-Jin Nor, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/048,620

(22) Filed: Feb. 19, 2016

(65) Prior Publication Data
US 2016/0172433 A1   Jun. 16, 2016

Related U.S. Application Data

(63) Continuation-in-part of application No. 13/843,594, filed on Mar. 15, 2013, now abandoned.

(30) Foreign Application Priority Data

Dec. 21, 2012  (KR) .......................... 10-2012-0151202

(51) Int. Cl.
*H01L 21/02*   (2006.01)
*H01L 21/311*  (2006.01)
*H01L 49/02*   (2006.01)
*H01L 21/321*  (2006.01)
*H01L 27/108*  (2006.01)

(52) U.S. Cl.
CPC .......... *H01L 28/60* (2013.01); *H01L 21/0206* (2013.01); *H01L 21/02068* (2013.01); *H01L 21/31111* (2013.01); *H01L 21/321* (2013.01); *H01L 27/1085* (2013.01); *H01L 27/10852* (2013.01); *H01L 28/90* (2013.01)

(58) Field of Classification Search
CPC ........... H01L 21/02334; H01L 21/0206; H01L 21/02068; H01L 21/31111
USPC ....................................................... 438/778
See application file for complete search history.

(56) References Cited

U.S. PATENT DOCUMENTS

| | | | | |
|---|---|---|---|---|
| 6,140,177 A | * | 10/2000 | Schafer | H01L 28/92 257/E21.02 |
| 2006/0263971 A1 | * | 11/2006 | Lee | H01L 27/10852 438/238 |
| 2011/0143541 A1 | * | 6/2011 | Ogawa | H01L 21/02043 438/694 |

(Continued)

*Primary Examiner* — Christine Enad
(74) *Attorney, Agent, or Firm* — IP & T Group LLP

(57) ABSTRACT

A surface treatment method for a semiconductor device includes providing a substrate where a plurality of projected patterns are formed, forming a hydrophobic coating layer on a surface of each of the plurality of projected patterns, rinsing the substrate with deionized water, and drying the substrate, wherein the hydrophobic coating layer is formed using a coating agent that includes phosphate having more than one hydrocarbon group, phosphonate having more than one hydrocarbon group, or a mixture thereof.

20 Claims, 13 Drawing Sheets

(56) References Cited

U.S. PATENT DOCUMENTS

2011/0189858 A1* 8/2011 Yasseri ............ H01L 21/02057
438/694
2013/0292647 A1* 11/2013 Laboriante ............ H01L 21/321
257/40

* cited by examiner

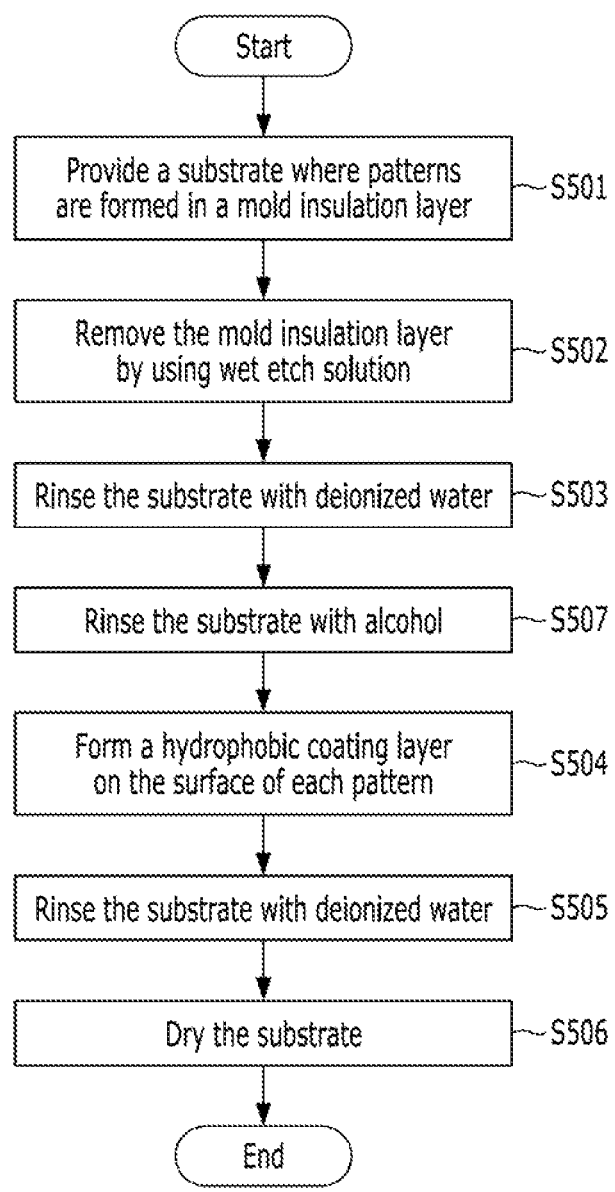

SURFACE TREATMENT METHOD FOR SEMICONDUCTOR DEVICE

CROSS-REFERENCE TO RELATED APPLICATIONS

This application is a continuation-in-part of U.S. patent application Ser. No. 13/843,594 filed on Mar. 15, 2013, which claims priority of Korean Patent Application No. 10-2012-0151202, filed on Dec. 21, 2012. The disclosure of each of the foregoing applications is incorporated herein by reference in its entirety.

BACKGROUND

1. Field

Exemplary embodiments of the present invention relate to a surface treatment method for a semiconductor device, and more particularly, to a surface treatment method that may prevent patterns from leaning, being bent, or collapsing in a semiconductor device.

2. Description of the Related Art

As semiconductor devices are integrated higher and higher, the height of patterns on a substrate becomes increased while the occupying area of the patterns on the substrate and the gap between the patterns are decreased. Examples of the patterns having a High Aspect Ratio (HAR) include Shallow Trench Isolation (STI) patterns of a flash memory device or capacitor patterns of a Dynamic Random Access Memory (DRAM) device.

When a rinsing process and a drying process are performed on the HAR patterns after a cleaning process or a wet etch process is performed, the HAR, patterns may lean, be bent, or collapse due to the stress caused by the surface tension of a cleaning solution or a rinsing solution and applied to the surface of the HAR patterns.

FIGS. 1A to 1C illustrate a problem of conventional HAR patterns.

Referring to FIG. 1A, a rinsing process is performed using a rinsing solution 3 on a substrate 1 where a plurality of patterns 2 is formed. The rinsing solution 3 may be deionized water. The rinsing process may be performed following a cleaning process or a wet etch process on the substrate 1.

Referring to FIG. 1B, a drying process is performed to remove the rinsing solution 3 remaining on the surface of the substrate 1.

Referring to FIG. 1C, stress is applied to the surface of the patterns 2 due to the surface tension of the rinsing solution 3 used in the rinsing process, causing the patterns 2 to lean, be bent, or collapse.

FIG. 2 illustrates the stress applied by the rinsing solution 3 to the patterns 2 over the substrate 1 during the drying process. Herein, the maximum stress applied to the patterns 2 is represented by the following Equation 1.

$$\sigma_{max} = 6\gamma \cdot \cos\theta \cdot A^2/D \quad \text{Eq. 1}$$

where $\gamma$ denotes the surface tension of the rinsing solution 3, $\theta$ denotes a contact angle of the rinsing solution 3 with respect to the surface of the patterns, A denotes an aspect ratio (the height of the patterns (H)/the width of the patterns (W), and D denotes the distance between the patterns 2.

To alleviate the stress applied from the rinsing solution 3 to the patterns 2 during the drying process in the above Equation 1, the aspect ratio A may be decreased or the distance D between the patterns 2 may be increased. However, since decreasing the aspect ratio A and increasing the distance D between the patterns 2 are all against increasing the integration degree, they may not be considered as a method for alleviating the stress applied from the rinsing solution 3 to the patterns 2. Therefore, to reduce the stress, the surface tension $\gamma$ of the rinsing solution 3 is made to decrease, or the contact angle $\theta$ of the rinsing solution 3 with respect to the surface of the patterns 2 is made close to 90°.

Capacitor patterns of a DRAM device have a tendency of decreasing pattern width and decreasing gap between the patterns to obtain fine patterns, while having their height increasing to secure a dielectric rate. The aspect ratio is approximately 40 or higher.

According to a conventional technology, a nitride floating cap (NFC) is deposited in the upper portion of the HAR patterns to protect the HAR patterns from leaning or being bent during the drying process of the HAR patterns. In this case, however, leaning or bending may occur in the middle of the HAR patterns, as the height of the patterns increases.

To mitigate this concern, a method of performing a rinsing process by using heated isopropyl alcohol (IPA) as a rinsing material and then performing a drying process has been suggested. Since the surface tension of isopropyl alcohol (IPA) may be approximately 20 dyne/cm, which may be much lower than the surface tension of water, i.e., approximately 70 dyne/cm, the above-described concern may be somewhat reduced.

However, as semiconductor devices are integrated more and more, the aspect ratio of patterns may increase higher and higher. Moreover, the technique using heated isopropyl alcohol (IPA) may be facing limitation. To protect patterns from leaning or being bent, a double supporter may be used, which may lead to an increase in the number of procedural steps and production cost.

Therefore, it may be required to develop a method for minimizing the stress applied from a rinsing solution to patterns in order to prevent the patterns from leaning or being bent in a drying process following a cleaning or rinsing process.

SUMMARY

Exemplary embodiments of the present invention are directed to a surface treatment method for a semiconductor device that may prevent a high aspect ratio (HAR) pattern from leaning, being bent, or collapsing by increasing the contact angle of a cleaning solution or a rinsing solution with respect to the pattern surface close to 90° and minimizing the stress applied to the HAR pattern during a drying process after a cleaning process or a rinsing process.

In accordance with an exemplary embodiment of the present invention, a surface treatment method for a semiconductor device includes providing a substrate where a plurality of projected patterns are formed, forming a hydrophobic coating layer on a surface of each of the plurality of projected patterns, rinsing the substrate with deionized water, and drying the substrate, wherein the hydrophobic coating layer is formed using a coating agent that includes phosphate having more than one hydrocarbon group, phosphonate having more than one hydrocarbon group, or a mixture thereof.

In accordance with another exemplary embodiment of the present invention, a surface treatment method for a semiconductor device includes providing a substrate where a plurality of patterns are formed in a mold insulation layer, removing the mold insulation layer by using a wet etch solution, rinsing the substrate from which the mold insulation layer is removed with deionized water, forming a hydrophobic coating layer on a surface of each of the plurality of patterns, rinsing the substrate where the hydrophobic coating layer is formed with deionized water, and drying the substrate, wherein the hydrophobic coating layer is formed using a coating agent that includes phosphate having more than one hydrocarbon group, phosphonate having more than one hydrocarbon group, or a mixture thereof.

In accordance with yet another exemplary embodiment of the present invention, a surface treatment method for a semiconductor device includes providing a substrate where a plurality of patterns are formed in a mold insulation layer, removing the mold insulation layer by using a wet etch solution, rinsing the substrate from which the mold insulation layer is removed with deionized water, treating the substrate with an SC-1 (NHOH+HO+OH) solution, rinsing the treated substrate with deionized water, forming a hydrophobic coating layer on a surface of each of plurality of the patterns rinsing the substrate where the hydrophobic coating layer is formed with deionized water, and drying the substrate, wherein the hydrophobic coating layer is, formed using a coating agent that includes phosphate having more than one hydrocarbon group phosphonate having more than one hydrocarbon group, or a mixture thereof.

In accordance with yet another exemplary embodiment of the present invention, a surface treatment method for a semiconductor device having capacitor patterns may provide a substrate where a plurality of projected capacitor patterns are formed in a mold insulation layer; removing the mold insulation layer by using a wet etch solution; rinsing the substrate from which the mold insulation layer is removed with deionized water; treating the substrate with an SC-1 (NHOH+HO+OH) solution; rinsing the treated substrate with deionized water; forming a hydrophobic coating layer on a surface of each of plurality of the projected capacitor patterns; rinsing the substrate where the hydrophobic coating layer is formed with deionized water; and drying the substrate, wherein the hydrophobic coating layer is formed using a coating agent that includes phosphate having more than one hydrocarbon group, phosphonate having more than one hydrocarbon group, or a mixture thereof.

The surface treatment method may further comprise: rinsing the substrate with alcohol before the forming of a hydrophobic coating layer on a surface of each of the plurality of projected capacitor patterns; rinsing the substrate with alcohol after the forming of a hydrophobic coating layer on a surface of each of the plurality of projected capacitor patterns; or rinsing the substrate with alcohol before and after the forming of a hydrophobic coating layer on a surface of each of the plurality of projected capacitor patterns. The hydrocarbon group may be a C1 to C30 hydrocarbon group. The coating agent may further include a solvent. The coating agent may further include alcohol. The surface treatment method may further include removing the hydrophobic coating layer after the drying of the substrate. The hydrophobic coating layer may be removed through at least one method selected from the group consisting of a rapid thermal annealing (RTA) process, a plasma treatment, an ultraviolet (UV) ray treatment, and an ashing process. The plurality of projected capacitor patterns may include a titanium nitride (TiN) capacitor pattern. The plurality of projected capacitor patterns may have a High Aspect Ratio (HAR) of approximately 40 or higher. The surface of each of the plurality of projected capacitor patterns may be etched by a thickness of 5 Å to 15 Å during the treating the substrate with an SC-1 (NHOH+HO+OH) solution. In accordance with yet another exemplary embodiment of the present invention, a surface treatment method for a semiconductor device may provide forming a plurality of projected patterns in a mold insulation layer over a substrate; removing the mold insulation layer by using a wet etch solution after the plurality of projected patterns are formed; rinsing the substrate from which the mold insulation layer is removed with deionized water after the mold insulation layer is removed; treating the substrate with an SC-1 (NHOH+HO+OH) solution after the substrate is rinsed with the deionized water; rinsing the treated substrate with deionized water after the substrate is treated with the SC-1 (NHOH+HO+OH) solution; forming a hydrophobic coating layer on a surface of each of plurality of the projected patterns; rinsing the substrate where the hydrophobic coating layer is formed with deionized water after the hydrophobic coating layer is formed thereby forming and drying the substrate which the hydrophobic coating layer is removed by the rinsing the substrate where the hydrophobic coating layer, wherein the hydrophobic coating layer is formed using a coating agent that includes phosphate having more than one hydrocarbon group, phosphonate having more than one hydrocarbon group, or a mixture thereof.

The surface treatment method may further comprise rinsing the substrate with alcohol before the forming of a hydrophobic coating layer on a surface of each of the plurality of projected capacitor patterns; rinsing the substrate with alcohol after the forming of a hydrophobic coating layer on a surface of each of the plurality of projected capacitor patterns; or rinsing the substrate with alcohol before and after the forming of a hydrophobic coating layer on a surface of each of the plurality of projected capacitor patterns. The hydrocarbon group may be a C1 to C30 hydrocarbon group. The coating agent may further include a solvent. The coating agent may further include alcohol. The surface treatment method may further comprise: removing the hydrophobic coating layer after the drying of the substrate. The hydrophobic coating layer may be removed through at least one method selected from the group consisting of a rapid thermal annealing (RTA) process, a plasma treatment, an ultraviolet (UV) ray treatment, and an aching process. The surface of each of the plurality of projected patterns may be etched by a thickness of 5 Å to 15 Å during the treating the substrate with an SC-1 (NHOH+HO+OH) solution. The plurality of projected capacitor patterns may have a High Aspect Ratio (HAIL) of approximately 40 or higher. The surface of each of the plurality of projected patterns may be etched by a thickness of 5 Å to 15 Å during the treating the substrate with an SC-1 (NHOH+HO+OH) solution.

BRIEF DESCRIPTION OF THE DRAWINGS

FIGS. 4A to 4D are flowcharts illustrating the surface treatment method for a semiconductor device in accordance with the embodiment of the present invention.

DETAILED DESCRIPTION

Figure 1A:
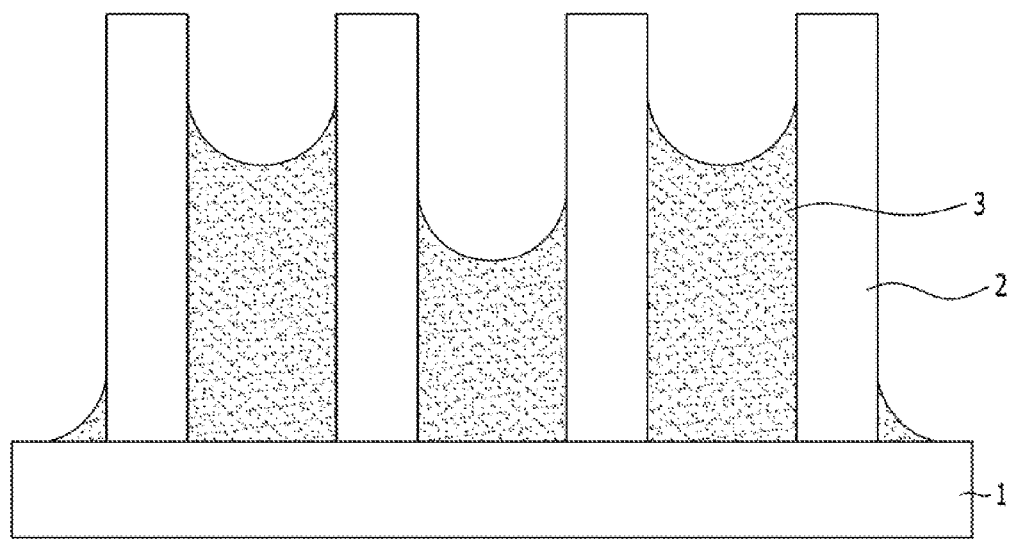
FIGS. 1A to 1C are diagrams illustrating a conventional HAR pattern.
Figure 1B:
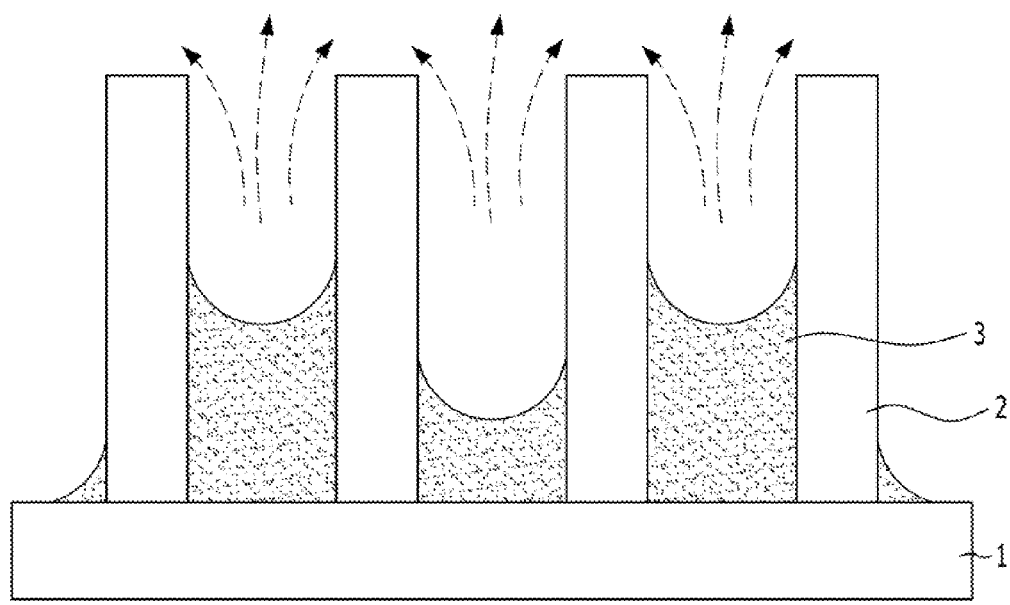
Figure 1C:
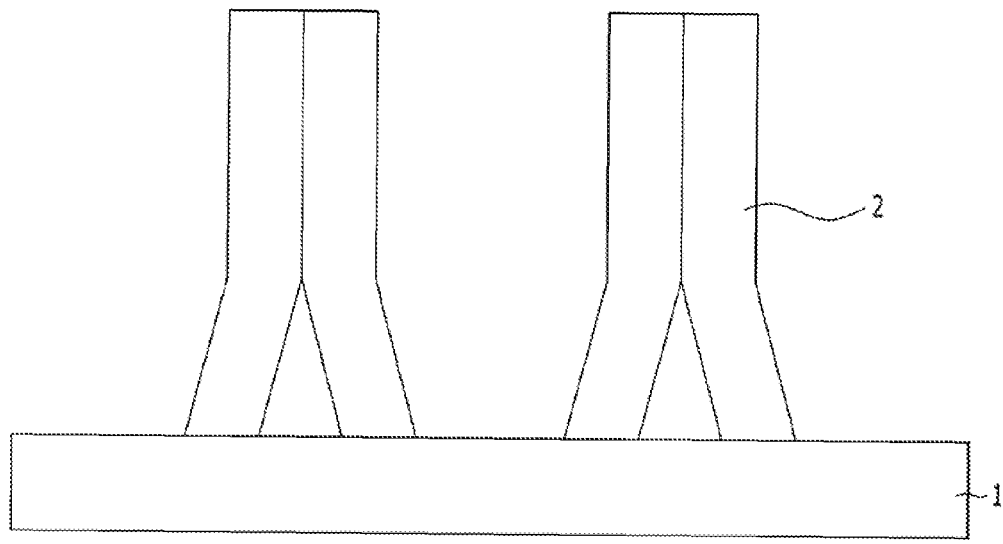
Figure 2:
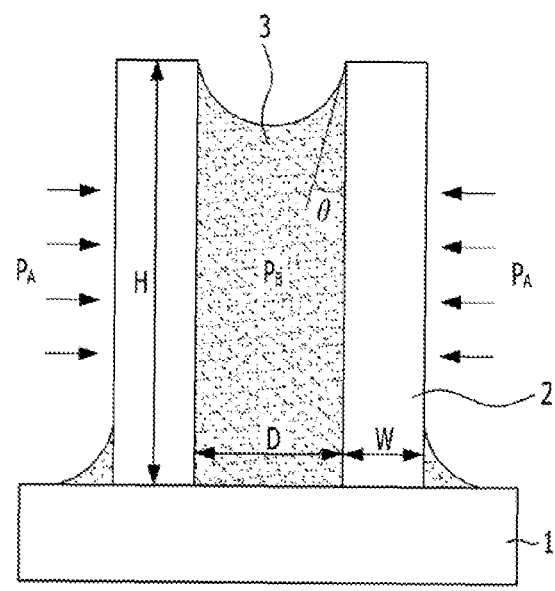
FIG. 2 a diagram illustrating the stress applied by the rinsing solution 3 to the pattern 2 over the substrate 1 during the drying process.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 3A to 3E are cross-sectional views illustrating a surface treatment method for a semiconductor device in accordance with an embodiment of the present invention.

Figure 3A:
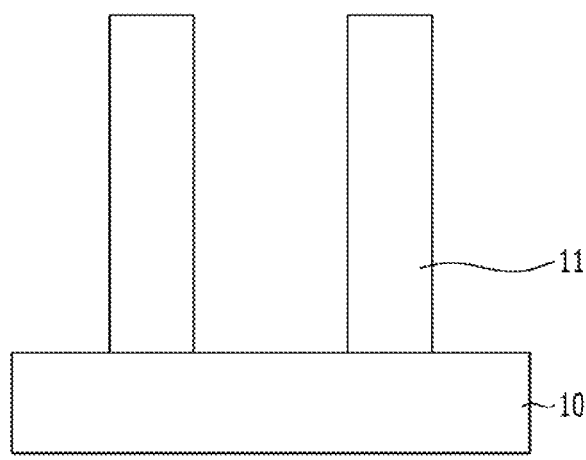
FIGS. 3A to 3E are cross-sectional views illustrating a surface treatment method for a semiconductor device in accordance with an embodiment of the present invention.

Referring to FIG. 3A, a substrate 10 having a plurality of projected patterns 11 is provided. The substrate 10 may be a semiconductor substrate, such as a silicon substrate. The substrate may include an insulation layer on its uppermost portion. Each of the plurality of projected patterns 11 may be a titanium nitride (TiN) capacitor pattern.

Figure 3B:
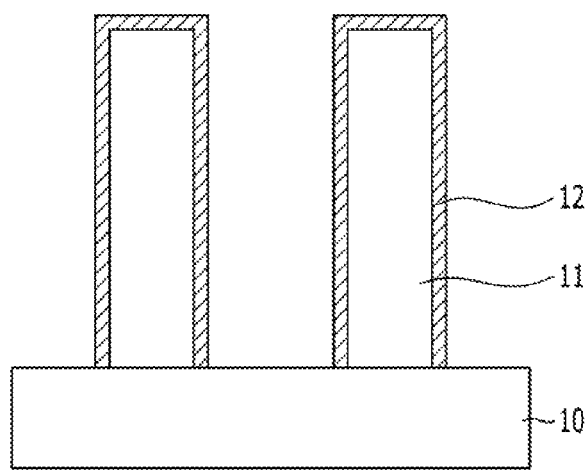

Referring to FIG. 3B, a hydrophobic coating layer 12 may be formed on the surface of each of the plurality of projected patterns 11.

The hydrophobic coating layer 12 is formed using a coating agent that includes phosphate having more than one hydrocarbon group, phosphonate having more than one hydrocarbon group, or a mixture thereof.

The hydrocarbon group of the coating agent gives hydrophobic property to the surface of each of the plurality of projected patterns 11. Therefore, the stress to be applied to each of the plurality of projected patterns 11 in the subsequent rinsing and drying processes may be minimized by increasing the contact angle to deionized water to the maximum level.

The hydrocarbon group may be a linear hydrocarbon. Since the linear hydrocarbon group that is formed of carbon atoms and hydrogen atoms is readily arrayed toward the outside from the surface of each of the plurality of projected patterns, the hydrophobic property given with respect to the surface of each of the plurality of projected patterns becomes higher.

The hydrocarbon group may be a $C_1$ to $C_{30}$ hydrocarbon group. Particularly, the hydrocarbon group may be at least one selected from the group consisting of a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, and an octadecyl group.

The phosphate or phosphonate moiety of the coating agent serves as a binder for stable bonding with each of the plurality of projected patterns 11. The phosphate or phosphonate moiety of the coating agent minimizes the damage or desorption of the coating layer in the subsequent rinsing process using deionized water, and thus maintains a high contact angle with respect to the deionized water until the drying process.

According to one embodiment of the present invention, the phosphate or phosphonate moiety of the coating agent may further include another substituent, such as a hydroxyl group.

The addition amount of a phosphate having more than one hydrocarbon group, a phosphonate having more than one hydrocarbon group, or a mixture thereof may be decided properly according to the specific process and condition. For example, the addition amount may range from approximately 0.1 wt % to approximately 30 wt % based on the total weight of the coating agent. Specifically, the addition amount may range from approximately 1 wt % to approximately 20 wt %, and more specifically, from approximately 5 wt % to approximately 15 wt %. Even more specifically, the addition amount may be approximately 10 wt %.

According to one embodiment of the present invention, the coating agent may further include a solvent.

The solvent, which has a high solubility with respect to the phosphate or phosphonate either having more than one hydrocarbon group and thus has little problem of eduction or chemical instability, is preferred. Also, the solvent, which has a similar specific gravity to that of deionized water and has excellent wettability with patterns such as titanium nitride (TiN), is preferred.

The solvent may be glycol ether. Particularly, the solvent may be n-propylene glycol n-methyl ether.

The amount of the solvent to be added may be decided properly according to the specific process and condition. For example, the amount of the solvent to be added may range from approximately 70 wt % to approximately 99.9 wt % based on the total weight of the coating agent. Specifically, the amount of the solvent to be added may range from approximately 80 wt % to approximately 99 wt %, and more specifically, from approximately 85 wt % to approximately 95 wt %. Even more specifically, the amount of the solvent to be added may be approximately 90 wt %.

According to one embodiment of the present invention, the coating agent may further include alcohol to increase the solubility to the solvent of the phosphate or phosphonate either having more than one hydrocarbon group.

The alcohol may be at least one selected from the group consisting of methanol, ethanol, isopropyl alcohol, and butanol.

The amount of the alcohol to be added is not limited specifically as long as the purpose of the present invention is not damaged. The amount of the alcohol to be added may be decided properly within the range of approximately 1 wt % or less based on the total weight of the coating agent.

The hydrophobic coating layer 12 may be formed on the surface of each of the projected patterns 11 by filling the region between the projected patterns 11 with the coating agent.

Figure 3C:
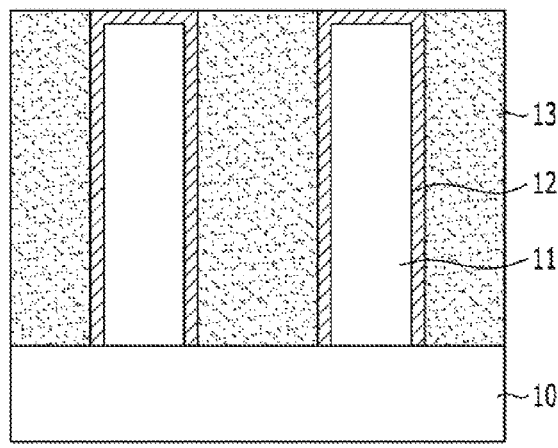

Referring to FIG. 3C, the substrate 10 is rinsed with deionized water 13.

Through the rinsing process, the coating agent remaining unreacted or the solvent in the coating agent may be removed. The rinsing time is not limited specifically, and the rinsing process is performed long enough to remove the coating agent remaining unreacted or the solvent in the coating agent.

Figure 3D:
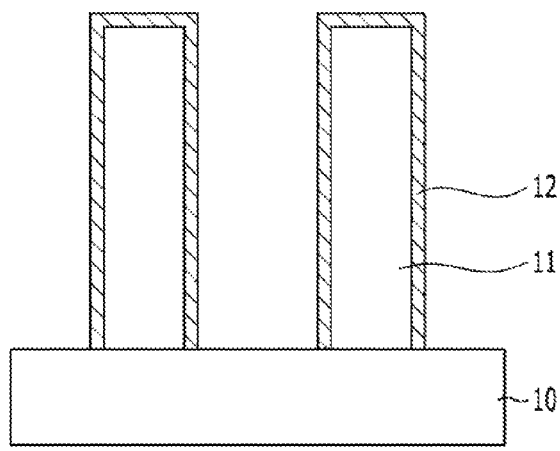

Referring to FIG. 3D, the substrate 10 is dried. The substrate 10 may be dried through a spin-drying process or an attraction drying process.

Herein, as the contact angle between the deionized water 13 and the surface of each of the projected patterns 11 becomes close to 90° due to the hydrophobic coating layer 12 formed on the surface of each of the projected patterns 11, the stress applied to each of the projected patterns 11 becomes almost 0. Therefore, leaning, bending or collapsing of the plurality of projected patterns 11 does not occur during the drying process.

Figure 3E:
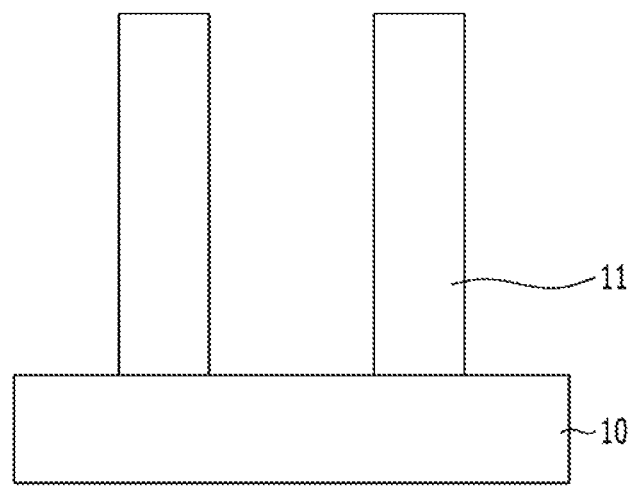

Referring to FIG. 3E, the hydrophobic coating layer 12 is removed.

The hydrophobic coating layer 12 may be removed through at least one method selected from the group consisting of a rapid thermal annealing (RTA) process, a plasma treatment, an ultraviolet (UV) ray treatment, and an ashing process.

The surface treatment method for a semiconductor device may be applied to a TiN capacitor structure without a nitride layer supporter and a TiN capacitor structure with one nitride layer supporter, which are structures where patterns may be bent or lean even though heated isopropyl alcohol according to a conventional technology is used.

FIGS. 4A to 4D are flowcharts illustrating the surface treatment method for a semiconductor device in accordance with the embodiment of the present invention.

Figure 4A:
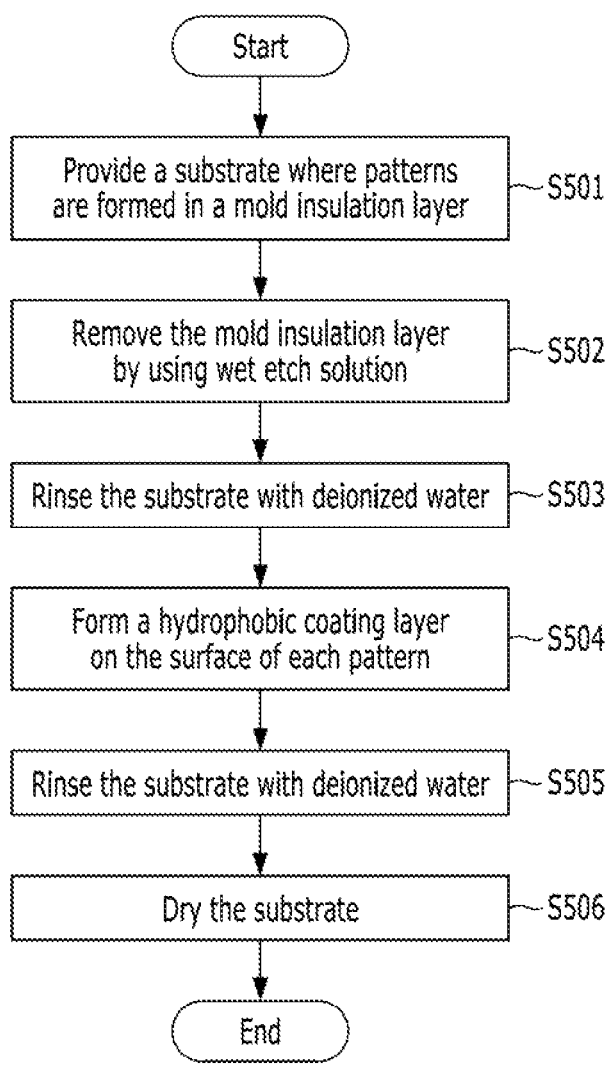

Referring to FIG. 4A, a substrate having a plurality of patterns formed in a mold insulation layer is provided in step S501. The substrate may be a semiconductor substrate, such as a silicon substrate. The substrate may include an insulation layer on its uppermost portion. The patterns may be DRAM capacitor patterns.

To be specific, the mold insulation layer is deposited over the substrate where a predetermined structure is formed. The mold insulation layer includes a material that becomes a mold of a DRAM capacitor. After the deposition of the mold insulation layer, an opening where a lower electrode is to be formed is formed through a dry etch process. A lower electrode layer is deposited in the inside of the opening, and then the lower electrode layer deposited in the upper portion of the mold insulation layer is removed through a Chemical Mechanical Polishing (CMP) process or a dry etch process. As a result, the plurality of patterns is formed in the mold insulation layer.

In step S502, the mold insulation layer is removed using a wet etch solution. Examples of the wet etch solution include hydrofluoric acid (HF) solution and Buffered Oxide Etchant (BOE) solution, but the scope and spirit of the present invention are not limited to it.

In step S503, the substrate from which the mold insulation layer is removed is rinsed with deionized water. Through the rinsing process, the wet etch solution used in the step S502 may be removed. The time taken for the rinsing process may not be limited specifically, and the rinsing process may be performed long enough to remove the wet etch solution.

In step S504, a hydrophobic coating layer is formed on the surface of each of the plurality of patterns. The hydrophobic coating layer is formed using a coating agent including phosphate having more than one hydrocarbon group, phosphonate having more than one hydrocarbon group, or a mixture thereof.

The hydrophobic coating layer fills the region between the plurality of patterns with the coating agent so as to be formed on the surface of each of the plurality of patterns.

Since the specific method for forming the hydrophobic coating layer and the coating agent are as described in the description of the above embodiment, they are not described herein.

In step S505, the substrate with the hydrophobic coating layer is rinsed with deionized water.

Through the rinsing process, the coating agent remaining unreacted or the solvent in the coating agent may be removed. The time taken for the rinsing process is not limited specifically, and the rinsing process is performed long enough to remove the coating agent remaining unreacted or the solvent in the coating agent.

In step S506, the substrate is dried. The substrate may be dried through a spin-drying process and an attraction drying process.

Herein, as the contact angle between the deionized water and the surface of each of the plurality of patterns becomes close to 90° due to the hydrophobic coating layer formed on the surface of each of the plurality of patterns, the stress applied to each of the plurality of patterns becomes almost 0. Therefore, leaning, bending or collapsing of the plurality of patterns does not occur during the drying process.

Subsequently, the hydrophobic coating layer may be removed as it is removed in the above-described embodiment of the present invention.

The hydrophobic coating layer may be removed through at least one method selected from the group consisting of a rapid thermal annealing (RTA) process, a plasma treatment, an ultraviolet (UV) ray treatment, and an ashing process.

FIG. 4B shows another surface treatment method for a semiconductor device. The surface treatment method of FIG. 4B is the same as the surface treatment method of FIG. 4A, except that step S507 of rinsing the substrate with alcohol is further included between the step S503 of rinsing the substrate from which the mold insulation layer is removed with deionized water and the step S504 of forming a hydrophobic coating layer on the surface of each of the plurality of patterns.

The additional rinsing step S507 is performed to improve the wettability between the surface of each of the plurality of patterns and the coating agent used when the hydrophobic coating layer is formed subsequently and to improve the exchangeability with the solution existing in the region between the plurality of patterns.

To this end, it is preferable to use alcohol. According to one embodiment, it is preferable to use isopropyl alcohol, but the scope and spirit of the invention are not limited to it.

Figure 4C:
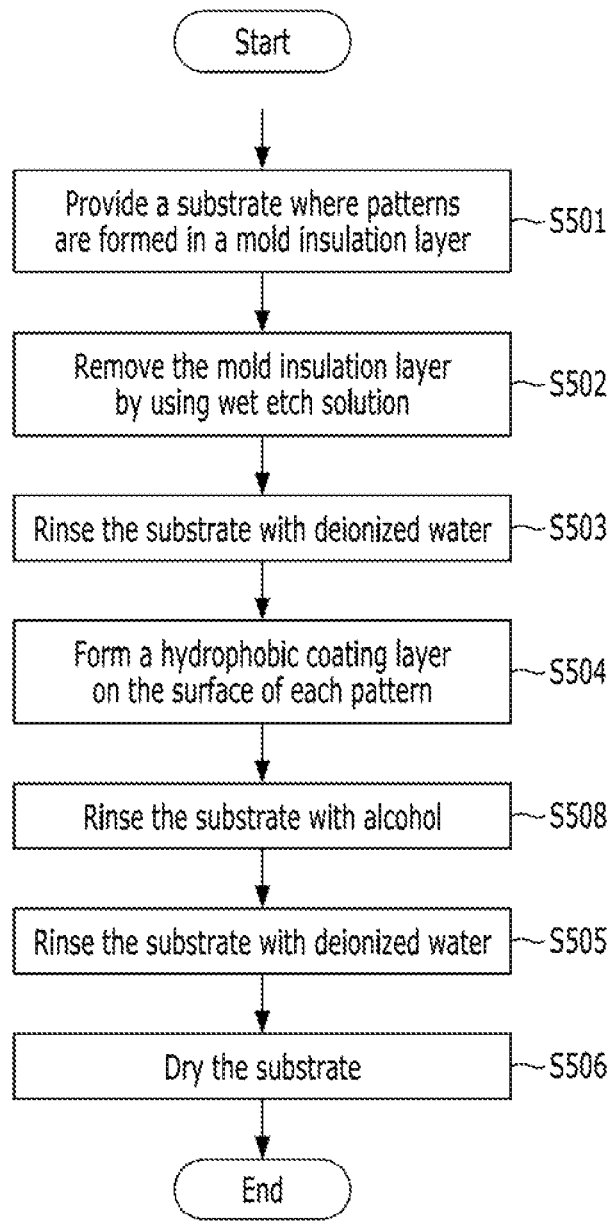

FIG. 4C shows another surface treatment method for a semiconductor device. The surface treatment method of FIG. 4C is the same as the surface treatment method of FIG. 4A, except that step S508 of rinsing the substrate with alcohol is further included between the step S504 of forming a hydrophobic coating layer on the surface of each of the plurality of patterns and the step S505 of rinsing the substrate where the hydrophobic coating layer is formed with deionized water.

The additional rinsing step S508 is performed to improve the re-array of the hydrophobic coating layer that is formed in the preceding step, and to improve the performance of the subsequent step of rinsing the substrate with deionized water.

To this end, it is preferable to use alcohol. According to one embodiment, it is preferable to use isopropyl alcohol, but the scope and spirit of the invention are not limited to it.

Figure 4D:
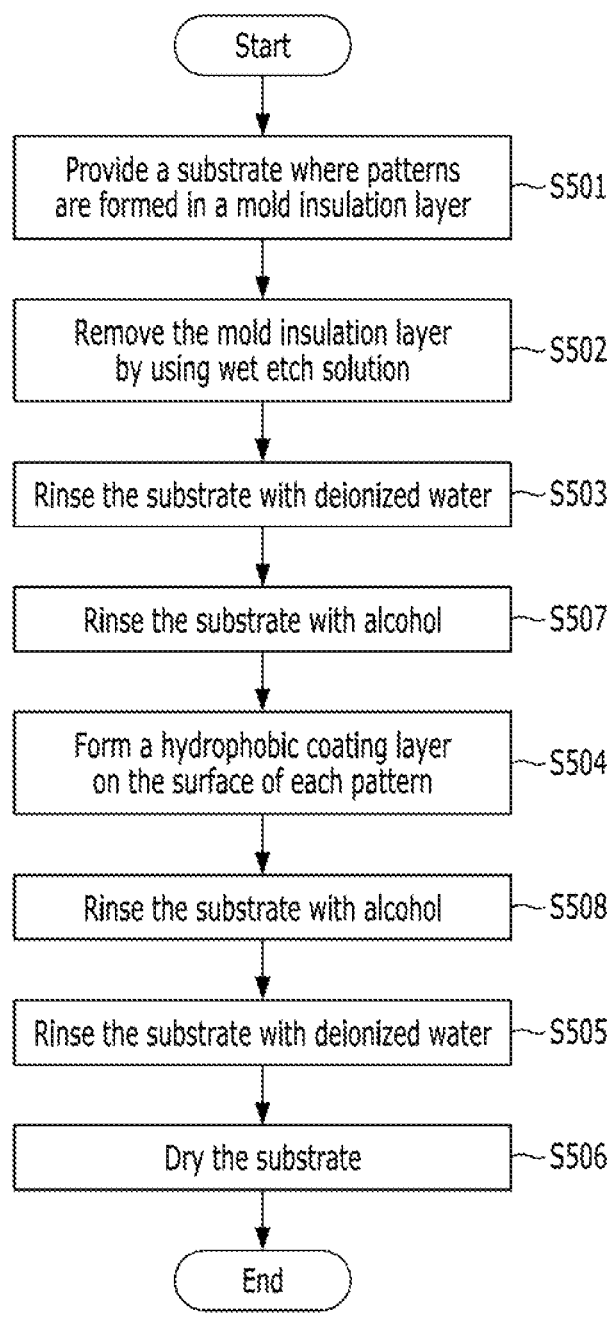

FIG. 4D shows another surface treatment method for a semiconductor device. The surface treatment method of FIG. 4D is the same as the surface treatment method of FIG. 4A, except that steps S507 and S508 of rinsing the substrate with alcohol are further included between the step S503 of rinsing the substrate from which the mold insulation layer is removed with deionized water and the step S504 of forming a hydrophobic coating layer on the surface of each of the plurality of patterns, and between the step S504 of forming a hydrophobic coating layer on the surface of each of the plurality of patterns and the step S505 of rinsing the substrate where the hydrophobic coating layer is formed with deionized water, respectively.

The additional rinsing step S507 is performed to improve the wettability between the surface of each of the plurality of patterns and the coating agent used when the hydrophobic coating layer is formed subsequently and to improve the exchangeability with the solution existing in the region between the plurality of patterns. Also, the additional rinsing step S508 is performed to improve the re-array of the hydrophobic coating layer, which is formed in the preceding step, and to improve the performance of the subsequent step of rinsing the substrate with deionized water.

To this end, it is preferable to use alcohol. According to one embodiment, it is preferable to use isopropyl alcohol, but the scope and spirit of the invention are not limited to it.

FIGS. 5A to 5D are flowcharts illustrating a surface treatment method for a semiconductor device in accordance with an embodiment of the present invention.

Figure 5A:
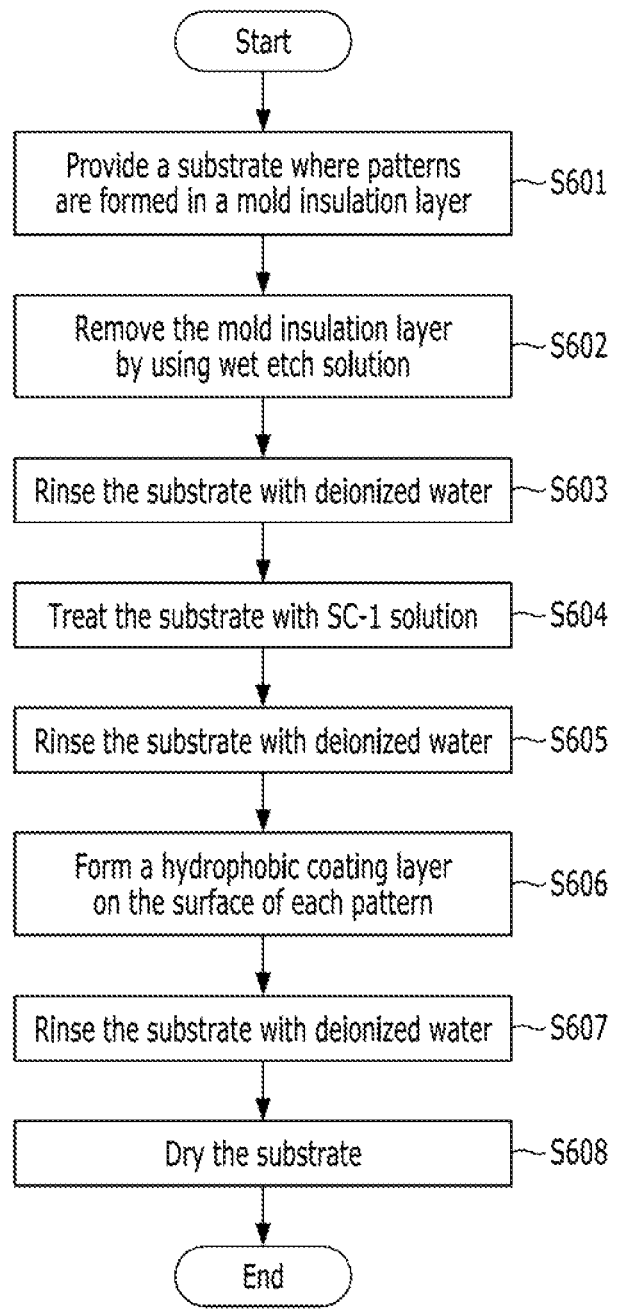
FIGS. 5A to 5D are flowcharts illustrating a surface treatment method for a semiconductor device in accordance with an embodiment of the present invention.

Referring to FIG. 5A, a substrate having a plurality of patterns formed in a mold insulation layer is provided in step S601. The substrate may be a semiconductor substrate, such as a silicon substrate. The substrate may include an insulation layer on its uppermost portion. The patterns may be DRAM capacitor patterns.

To be specific, the mold insulation layer is deposited over the substrate where a predetermined structure is formed. The mold insulation layer includes a material that becomes a mold of a DRAM capacitor. After the deposition of the mold insulation layer, an opening where a lower electrode is to be formed is formed through a dry etch process. A lower electrode layer is deposited in the inside of the opening, and then the lower electrode layer deposited in the upper portion of the mold insulation layer is removed through a Chemical Mechanical Polishing (CMP) process or a dry etch process. As a result, the plurality of patterns is formed in the mold insulation layer.

In step S602, the mold insulation layer is removed using a wet etch solution. Examples of the wet etch solution include hydrofluoric acid (HF) solution and Buffered Oxide Etchant (BOE) solution, but the scope and spirit of the present invention are not limited to it.

In step S603, the substrate from which the mold insulation layer is removed is rinsed with deionized water. Through the rinsing process, the wet etch solution used in the step S602 may be removed. The time taken for the rinsing process is not limited specifically, and the rinsing process is performed long enough to remove the wet etch solution.

In step S604, the substrate is treated with an SC-1 (NHOH+HO+OH) solution. The treatment with SC-1 solution is performed not only to improve the coating property in the subsequent process by forming a thin oxide layer on the surface of each of the plurality of projected patterns but also to improve the performance of a capacitor by removing particles through the cleaning process, thereby controlling bridge defects.

A fine etching process is performed to the plurality of projected patterns during the treatment with SC-1 solution in the step S604, so that distances between the plurality of projected patterns are secured and a deposition rate and a thickness of a dielectric layer during substance process will be greater. The surface of each of the plurality of projected patterns are etched by a thickness of approximately 5 Å to approximately 15 Å. The coating agent having a high viscosity is permeated to the surface of each of the plurality of projected patterns, so that the coating property of the coating agent is improved.

A cleaning process is performed to the plurality of projected patterns during the treatment with SC-1 solution in the step S604, so that metallic particles between the plurality of projected patterns is removed, thereby reducing electrical bridge defects between the plurality of projected patterns. The thin oxide layer formed on the surface of each of the plurality of projected patterns to improve the performance of a capacitor by preventing a bridge from occurring between the plurality of projected patterns and the coating property of the coating agent is dramatically improved.

In step S605, the substrate treated with the SC-1 solution is rinsed with deionized water. Through the rinsing process, the SC-1 solution may be removed. The time taken for the rinsing process is not limited specifically, and the rinsing process is performed long enough to remove the SC-1 solution.

In step S606, a hydrophobic coating layer is formed on the surface of each of the plurality of projected patterns. The hydrophobic coating layer is formed using a coating agent including phosphate having more than one hydrocarbon group, phosphonate having more than one hydrocarbon group, or a mixture thereof.

The hydrophobic coating layer fills the region between the plurality of projected patterns with the coating agent so as to be formed on the surface of each of the plurality of projected patterns.

Since the specific method for forming the hydrophobic coating layer and the coating agent are as described in the description of the above embodiment, they are not described herein.

In step S607, the substrate with the hydrophobic coating layer is rinsed with deionized water.

Through the rinsing process, the coating agent remaining unreacted or the solvent in the coating agent may be removed. The time taken for the rinsing process is not limited specifically, and the rinsing process is performed long enough to remove the coating agent remaining unreacted or the solvent in the coating agent.

In step S608, the substrate is dried. The substrate may be dried through a spin-drying process and an attraction drying process.

Herein, as the contact angle between the deionized water and the surface of each of the plurality of projected patterns becomes close to 90° due to the hydrophobic coating layer formed on the surface of each of the plurality of projected patterns, the stress applied to each of the plurality of projected patterns becomes almost 0. Therefore, leaning, bending or collapsing of the projected patterns does not occur during the drying process.

Subsequently, the hydrophobic coating layer may be removed as it is removed in the above-described embodiment of the present invention.

The hydrophobic coating layer may be removed through at least one method selected from the group consisting of a rapid thermal annealing (RTA) process, a plasma treatment, an ultraviolet (UV) ray treatment, and an ashing process.

Figure 5B:
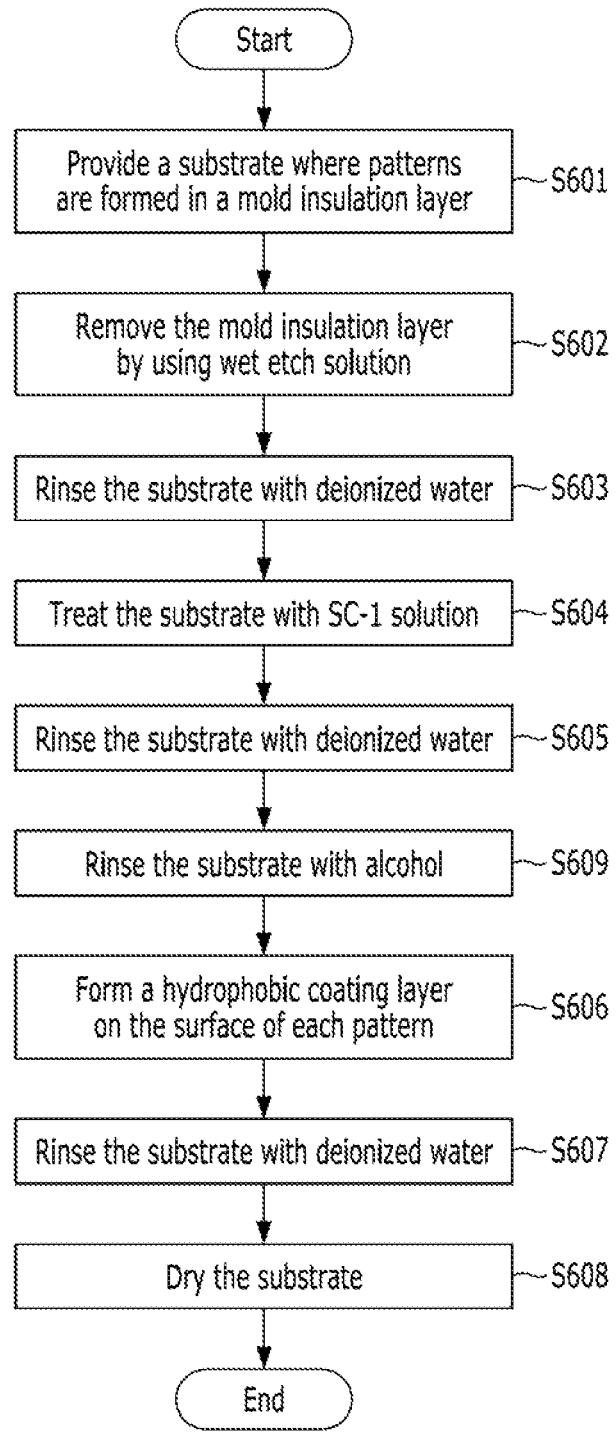

FIG. 5B shows another surface treatment method for a semiconductor device. The surface treatment method of FIG. 5B is the same as the surface treatment method of FIG. 5A, except that step S609 of rinsing the substrate with alcohol is further included between the step S605 of rinsing the substrate with deionized water and the step S606 of forming a hydrophobic coating layer on the surface of each of the plurality of projected patterns.

The additional rinsing step S609 is performed to improve the wettability between the surface of each of the plurality of projected patterns and the coating agent used when the hydrophobic coating layer is formed subsequently and to improve the exchangeability with the solution existing in the region between the plurality of projected patterns.

To this end, it is preferable to use alcohol. According to one embodiment, it is preferable to use isopropyl alcohol, but the scope and spirit of the invention are not limited to it.

Figure 5C:
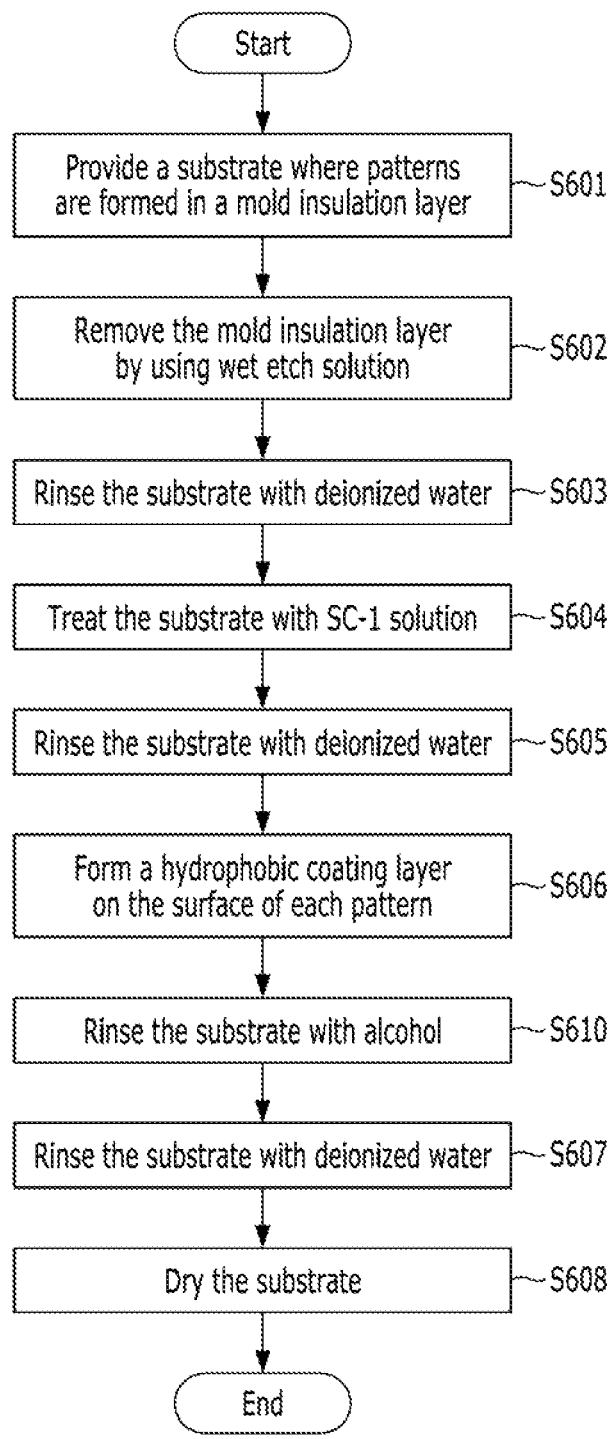

FIG. 5C shows another surface treatment method for a semiconductor device. The surface treatment method of FIG. 5C is the same as the surface treatment method of FIG. 5A, except that step S610 of rinsing the substrate with alcohol is further included between the step S606 of forming a hydrophobic coating layer on the surface of each of the plurality of projected patterns and the step S607 of rinsing the substrate where the hydrophobic coating layer is formed with deionized water.

The additional rinsing step S610 is performed to improve the re-array of the hydrophobic coating layer, which is formed in the preceding step, and to improve the performance of the subsequent step of rinsing the substrate with deionized water.

To this end, it is preferable to use alcohol. According to one embodiment, it is preferable to use isopropyl alcohol, but the scope and spirit of the invention are not limited to it.

Figure 5D:
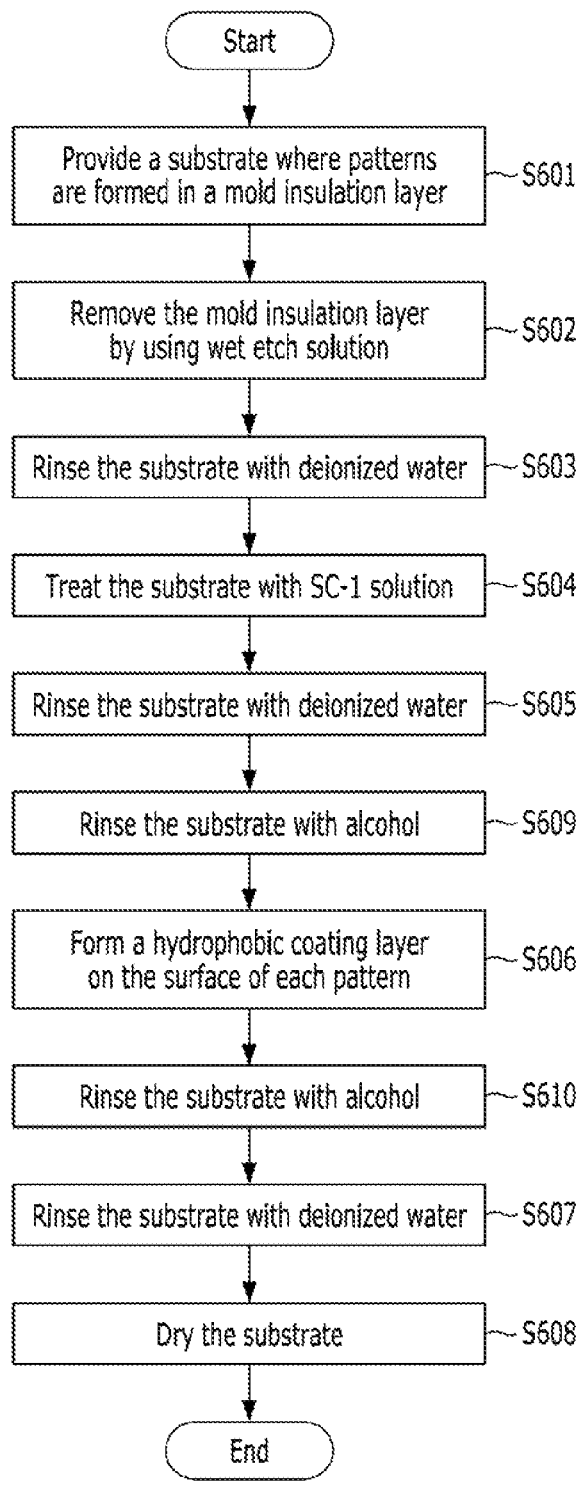

FIG. 5D shows another surface treatment method for a semiconductor device. The surface treatment method of FIG. 5D is the same as the surface treatment method of FIG. 5A, except that steps S609 and S610 of rinsing the substrate with alcohol are further included between the step S605 of rinsing the substrate with deionized water and the step S606 of forming a hydrophobic coating layer on the surface of each of the plurality of projected patterns, and between the step S606 of forming a hydrophobic coating layer on the surface of each of the plurality of projected patterns and the step S607 of rinsing the substrate where the hydrophobic coating layer is formed with deionized water, respectively.

The additional rinsing step S609 is performed to improve the wettability between the surface of each of the plurality of projected patterns and the coating agent used when the hydrophobic coating layer is formed subsequently and to improve the exchangeability with the solution existing in the region between the plurality of projected patterns. Also, the additional rinsing step S610 is performed to improve the re-array of the hydrophobic coating layer, which is formed in the preceding step, and to improve the performance of the subsequent step of rinsing the substrate with deionized water.

To this end, it is preferable to use alcohol. According to one embodiment, it is preferable to use isopropyl alcohol, but the scope and spirit of the invention are not limited to it.

According to the surface treatment method for a semiconductor device in accordance with the embodiments of the present invention, it may be possible to prevent HAR patterns from leaning, being bent, or collapsing in the rinsing and drying processes performed on the HAR patterns by increasing the contact angle of a rinsing solution with respect to the surface of the HAR patterns close to 90° and thus minimizing the stress applied from the rinsing solution to the HAR patterns.

Also, according to the surface treatment method for a semiconductor device in accordance with the embodiments of the present invention, since the stress applied to the patterns is minimized, it may not need to use NFC to prevent leaning of the patterns. This decreases the number of procedural steps, decreases the stress caused by a nitride layer, and improves step coverage in the subsequent process of forming a dielectric layer, thus improving device characteristics.

While the present invention has been described with respect to the specific embodiments, it will be apparent to those skilled in the art that various changes and modifications may be made without departing from the spirit and scope of the invention as defined in the following claims.

For example, the technology of the present invention described above is applied not only to the embodiments described above but also to all surface treatment method for semiconductor devices including a drying process following a cleaning or rinsing process that is performed on the patterns formed on a substrate in order to prevent the patterns from leaning, being bent, or collapsing by increasing the contact angle of a cleaning solution or a rinsing solution with respect to the pattern surface close to 90° and thus minimizing the stress applied to the patterns.

What is claimed is:

1. A surface treatment method for a semiconductor device having capacitor patterns, comprising:
   providing a substrate, where projected capacitor patterns including a metal-containing material are formed, in a mold insulation layer;
   removing the mold insulation layer by using a wet etch solution;
   rinsing the substrate, from which the mold insulation layer is removed, with deionized water;
   treating the substrate, where the projected capacitor patterns are formed, with an SC-1 (NHOH+HO+OH) solution;
   rinsing the treated substrate with deionized water;
   forming a hydrophobic coating layer on a surface of each of the projected capacitor patterns;
   rinsing the substrate, where the hydrophobic coating layer is formed, with deionized water; and
   drying the substrate,
   wherein the hydrophobic coating layer is formed using a coating agent that includes phosphate, wherein the phosphonate has more than one hydrocarbon group,
   wherein each of the projected capacitor patterns is thinned during the treating the substrate with the SC-1 solution.

2. The surface treatment method of claim 1, further comprising:
   rinsing the substrate with alcohol before the forming of the hydrophobic coating layer on the surface of each of the projected capacitor patterns;
   rinsing the substrate with alcohol after the forming of the hydrophobic coating layer on the surface of each of the projected capacitor patterns; or
   rinsing the substrate with alcohol before and after the forming of the hydrophobic coating layer on the surface of each of the plurality of projected capacitor patterns.

3. The surface treatment method of claim 1, wherein the hydrocarbon group is a $C_1$ to $C_{30}$ hydrocarbon group.

4. The surface treatment method of claim 1, wherein the coating agent further includes a solvent.

5. The surface treatment method of claim 1, wherein the coating agent further includes alcohol.

6. The surface treatment method of claim 1, further comprising:
   removing the hydrophobic coating layer after the drying of the substrate.

7. The surface treatment method of claim 6, wherein the hydrophobic coating layer is removed through at least one method selected from the group consisting of a rapid thermal annealing (RTA) process, a plasma treatment, an ultraviolet (UV) ray treatment, and an ashing process.

8. The surface treatment method of claim 1, wherein the metal-containing material include a titanium nitride (TiN) capacitor pattern.

9. The surface treatment method of claim 1, wherein each of the projected capacitor patterns has a High Aspect Ratio (HAR) of approximately 40 or higher.

10. The surface treatment method of claim 1, wherein each of the projected capacitor patterns is thinned by a thickness of 5 Å to 15 Å during the treating the substrate with the SC-1 (NHOH+HO+OH) solution.

11. The surface treatment method of claim 1, wherein each of the projected capacitor patterns have a High Aspect Ratio (HAR) of approximately 40 or higher.

12. A surface treatment method for a semiconductor device, comprising:
    forming projected patterns, each of which includes a metal-containing material, in a mold insulation layer over a substrate;
    removing the mold insulation layer by using a wet etch solution after the projected patterns are formed;
    rinsing the substrate from which the mold insulation layer is removed with deionized water after the mold insulation layer is removed;
    treating the substrate with an SC-1 (NHOH+HO+OH) solution after the substrate is rinsed with the deionized water;
    rinsing the treated substrate with deionized water after the substrate is treated with the SC-1 (NHOH+HO+OH) solution;
    forming a hydrophobic coating layer on a surface of each of the projected patterns;
    rinsing the substrate where the hydrophobic coating layer is formed with deionized water after the hydrophobic coating layer is formed, wherein a remaining unreacted hydrophobic coating layer is removed; and
    drying the substrate where the hydrophobic coating layer is formed,
    wherein the hydrophobic coating layer is formed using a coating agent that includes phosphate, phosphonate having more than one hydrocarbon group,
    wherein the surface of each of the projected patterns is etched during the treating the substrate with the SC-1 solution.

13. The surface treatment method of claim 12, further comprising:
    rinsing the substrate with alcohol before the forming of the hydrophobic coating layer on the surface of each of the projected capacitor patterns;
    rinsing the substrate with alcohol after the forming of the hydrophobic coating layer on the surface of each of the plurality of projected capacitor patterns; or
    rinsing the substrate with alcohol before and after the forming of the hydrophobic coating layer on the surface of each of the projected capacitor patterns.

14. The surface treatment method of claim 12, wherein the hydrocarbon group is a $C_1$ to $C_{30}$ hydrocarbon group.

15. The surface treatment method of claim 12, wherein the coating agent further includes a solvent.

16. The surface treatment method of claim 12, wherein the coating agent further includes alcohol.

17. The surface treatment method of claim 16, wherein the hydrophobic coating layer is removed through at least one method selected from the group consisting of a rapid thermal annealing (RTA) process, a plasma treatment, an ultraviolet (UV) ray treatment, and an ashing process.

18. The surface treatment method of claim 12, further comprising:
    removing the hydrophobic coating layer after the drying of the substrate.

19. The surface treatment method of claim 12, wherein the surface of each of the projected patterns is etched by a thickness of 5 Å to 15 Å during the treating the substrate with the SC-1 (NHOH+HO+OH) solution.

20. The surface treatment method of claim 12, wherein the metal-containing material includes a titanium nitride (TiN) capacitor pattern.

* * * * *